(12) United States Patent
Kojima (10) Patent No.: US 7,373,574 B2
(45) Date of Patent: May 13, 2008

(54) SEMICONDUCTOR TESTING APPARATUS AND METHOD OF TESTING SEMICONDUCTOR

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/176,300

(22) Filed: Jul. 8, 2005

(65) Prior Publication Data

US 2006/0010360 A1    Jan. 12, 2006

(30) Foreign Application Priority Data

Jul. 9, 2004    (JP)    ............................. 2004-203278

(51) Int. Cl.
G01R 31/28    (2006.01)
G06F 11/00    (2006.01)

(52) U.S. Cl. .................. 714/738; 324/158.1; 324/765; 324/763; 324/73.1; 324/755; 714/724; 714/726; 714/736; 714/733

(58) Field of Classification Search ......... 714/100–825
See application file for complete search history.

(56) References Cited

U.S. PATENT DOCUMENTS

| | | | | |
|---|---|---|---|---|
| 5,184,062 A | * | 2/1993 | Ladwig | 324/74 |
| 5,210,527 A | * | 5/1993 | Smith et al. | 340/659 |
| 5,440,210 A | * | 8/1995 | Bogaty et al. | 315/383 |
| 5,798,701 A | * | 8/1998 | Bernal et al. | 340/628 |
| 6,008,746 A | * | 12/1999 | White | 341/70 |
| 6,133,725 A | | 10/2000 | Bowhers | |
| 6,292,415 B1 | * | 9/2001 | Brehm | 365/201 |
| 6,563,298 B1 | | 5/2003 | Creek et al. | |
| 6,587,811 B2 | * | 7/2003 | Schleifer et al. | 702/176 |
| 6,636,098 B1 | * | 10/2003 | Kizer | 327/345 |
| 6,703,825 B1 | * | 3/2004 | Creek et al. | 324/158.1 |
| 6,791,890 B2 | * | 9/2004 | Ooishi | 365/201 |
| 6,826,390 B1 | * | 11/2004 | Tamura | 455/226.1 |
| 6,833,715 B2 | * | 12/2004 | Sakaguchi et al. | 324/713 |
| 6,979,996 B2 | * | 12/2005 | Fleishman | 324/158.1 |
| 7,046,056 B2 | * | 5/2006 | Kizer et al. | 327/147 |
| 2003/0179028 A1 | * | 9/2003 | Kizer et al. | 327/158 |
| 2003/0231537 A1 | * | 12/2003 | Stark | 365/201 |
| 2005/0189971 A1 | * | 9/2005 | Kizer et al. | 327/147 |
| 2005/0231188 A1 | * | 10/2005 | Wang et al. | 324/117 R |
| 2007/0096709 A1 | * | 5/2007 | Brown | 323/283 |

* cited by examiner

*Primary Examiner*—Jacques Louis-Jacques
*Assistant Examiner*—Guerrier Merant
(74) *Attorney, Agent, or Firm*—Sughrue Mion, PLLC (57) ABSTRACT

A semiconductor testing apparatus, includes a test signal generating unit that generates a test signal corresponding to a test pattern to output the generated test signal to a device under test (DUT); a comparison signal generating unit that generates a comparison signal by combining a reference signal and the test signal; and a comparing unit that compares a response signal, which is output from the DUT in response to the input of the test signal, and the reference signal by offsetting the test signal contained in a composite signal of the test signal and the response signal and the test signal contained in the comparison signal. The DUT is determined to be defective or not based on a result of comparison by the comparing unit.

15 Claims, 10 Drawing Sheets

SEMICONDUCTOR TESTING APPARATUS AND METHOD OF TESTING SEMICONDUCTOR

CROSS-REFERENCE TO RELATED APPLICATIONS

This application is based upon and claims the benefit of priority from the priority Japanese Patent Application No. 2004-203278, filed on Jul. 9, 2004; the entire contents of which are incorporated herein by reference.

BACKGROUND OF THE INVENTION

1. Field of the Invention

The present invention relates to semiconductor testing apparatuses and methods of testing semiconductors for determining whether a semiconductor device under test is defective or not.

2. Description of the Related Art

A semiconductor testing apparatus provides a test signal as an output to a semiconductor device such as an integrated circuit, and determines whether the semiconductor device is defective or not based on a response signal supplied from the semiconductor device in response. The semiconductor testing apparatus includes plural semiconductor testing circuits, each of which is electrically connected to one of nodes of the semiconductor device under test (DUT). The semiconductor testing circuit applies a test signal to the node of the DUT, detects a response signal supplied from the DUT in response to the applied test signal, and compares the detected response signal with a predetermined reference signal. Generally, the semiconductor testing apparatus determines that the DUT is defective when the detected response signal does not match with the reference signal.

One type of such semiconductor testing circuits employs single transmission connection where an output part for the test signal and an input part for the response signal in the semiconductor testing apparatus are connected to the DUT via a single transmission line. When the single transmission connection is adopted, however, the semiconductor testing apparatus is held in a stand-by state during the reciprocation of the signal when the direction of signal transmission is changed. This delay is called a "round-trip delay." Another type of the semiconductor testing circuits employs dual transmission connection where separate transmission lines are used for the connection between the DUT and the output part for the test signal in the semiconductor testing apparatus and for the connection between the DUT and the input part for the response signal in the semiconductor testing apparatus. When the dual transmission connection is employed, however, the amount of necessary wirings is doubled thereby complicates the structure of the semiconductor testing apparatus. In addition, the dual transmission connection cannot be utilized when driving capacity of the DUT is not sufficient, because the impedance of the line driven by an output terminal of the DUT is halved in the dual transmission connection.

Figure 9:
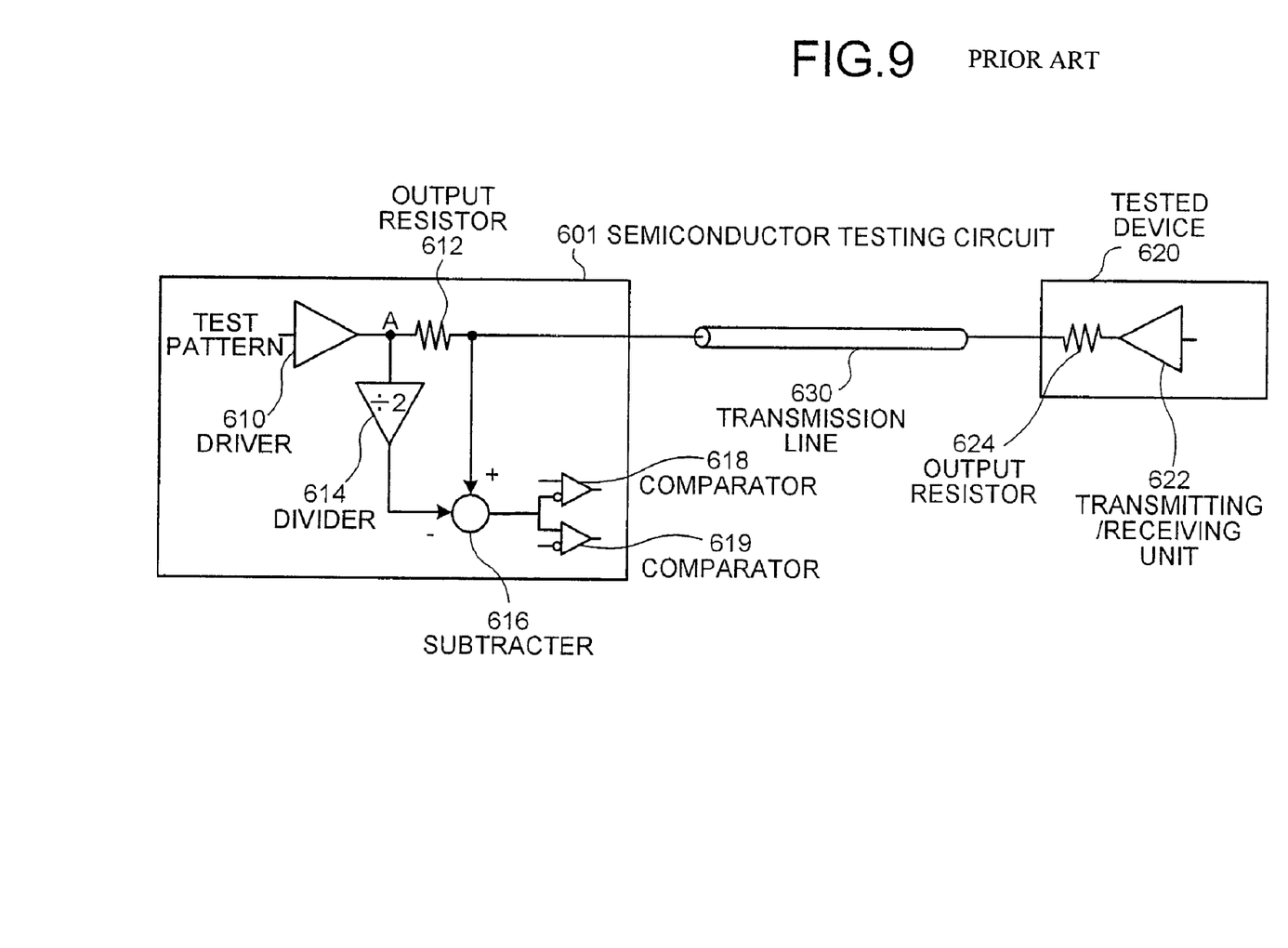
FIG. 9 is a diagram of a structure of a semiconductor testing circuit according to a conventional art.

Hence, a semiconductor testing circuit 601 as shown in FIG. 9 is proposed to eliminate such inconvenience (see U.S. Pat. No. 6,133,725). In the semiconductor testing circuit 601, a subtracter 616 receives at one input part thereof a composite signal generated as a sum of a test signal output from a driver 610 and a response signal output from a DUT 620. On the other hand, the subtracter 616 receives at another input part the test signal output from the driver 610. The subtracter 616 subtracts the test signal from the composite signal of the test signal and the response signal, to output the resulting signal to comparators 618 and 619 as a response signal. Each of the comparators 618 and 619 receives a predetermined reference signal to compare the same with the response signal. When the response signal does not match with the predetermined reference signal, each of the comparators 618 and 619 outputs a predetermined error signal. The semiconductor testing apparatus determines that the DUT 620 is defective when the comparators 618 and 619 output the error signals.

Figure 10:
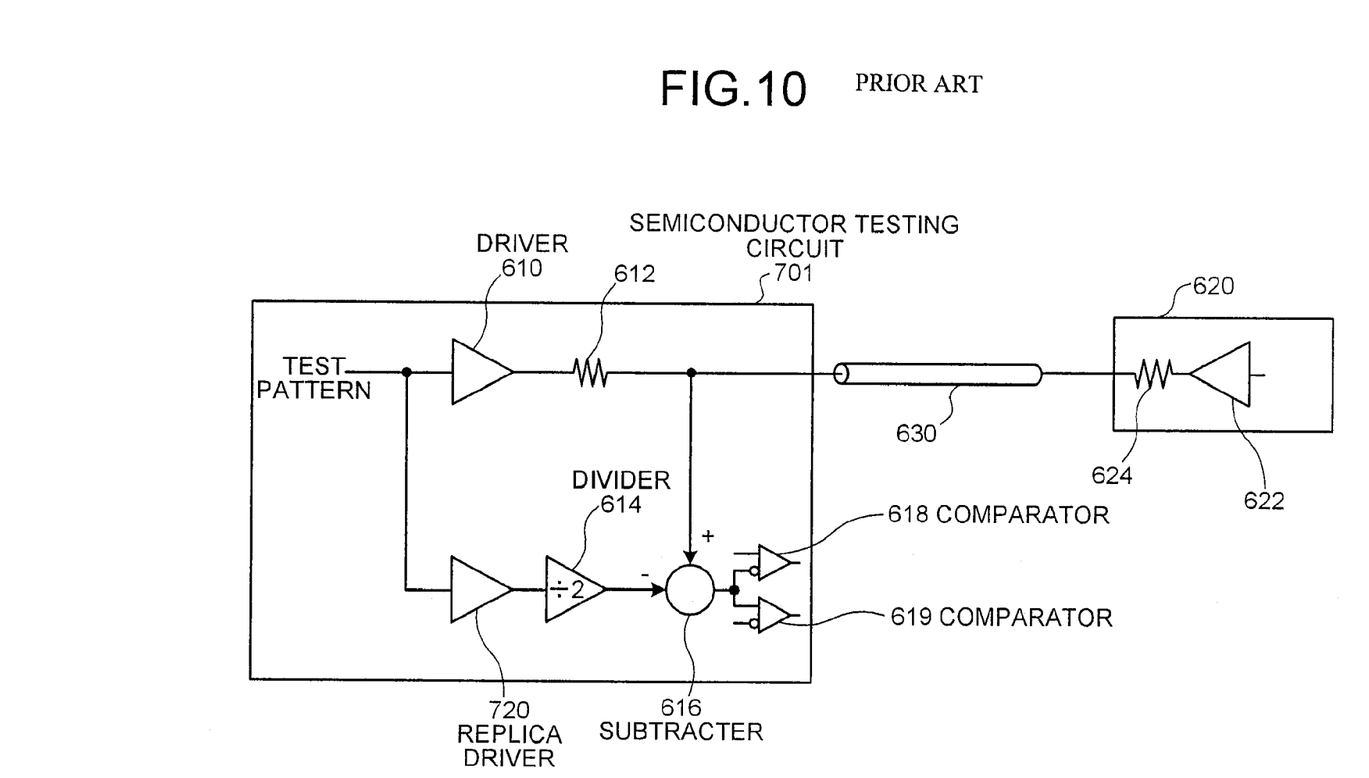
FIG. 10 is a diagram of another example of the structure of the semiconductor testing circuit according to the conventional art.

Thus, the semiconductor testing circuit 601 can eliminate the problem of the round-trip delay described above by supplying the response signal, which is a difference between the composite signal of the test signal and the response signal and the test signal, to the comparators 618 and 619. In addition, since the semiconductor testing circuit 601 is connected to the DUT 620 via a single transmission line 630, the apparatus can be realized in a simple structure. Further, another semiconductor testing circuit 701 as shown in FIG. 10 is proposed which includes a replica driver 720 in addition to the elements included in the semiconductor testing circuit 601 (see U.S. Pat. Nos. 6,563,298 and 6,703,825).

Here, the semiconductor testing circuits 601 and 701 respectively shown in FIGS. 9 and 10 are structured as to include the analog subtracter 616. Generally, it is difficult to satisfy requirements such as an improvement in operation precision, an increase in process speed, and adjustment to broad voltage range at the same time, with the analog subtracter. Hence, the semiconductor testing circuits 601 and 701 can adjust only to a limited voltage range and are incapable of performing a highly precise comparison at the comparators 618 and 619.

Figure 11:
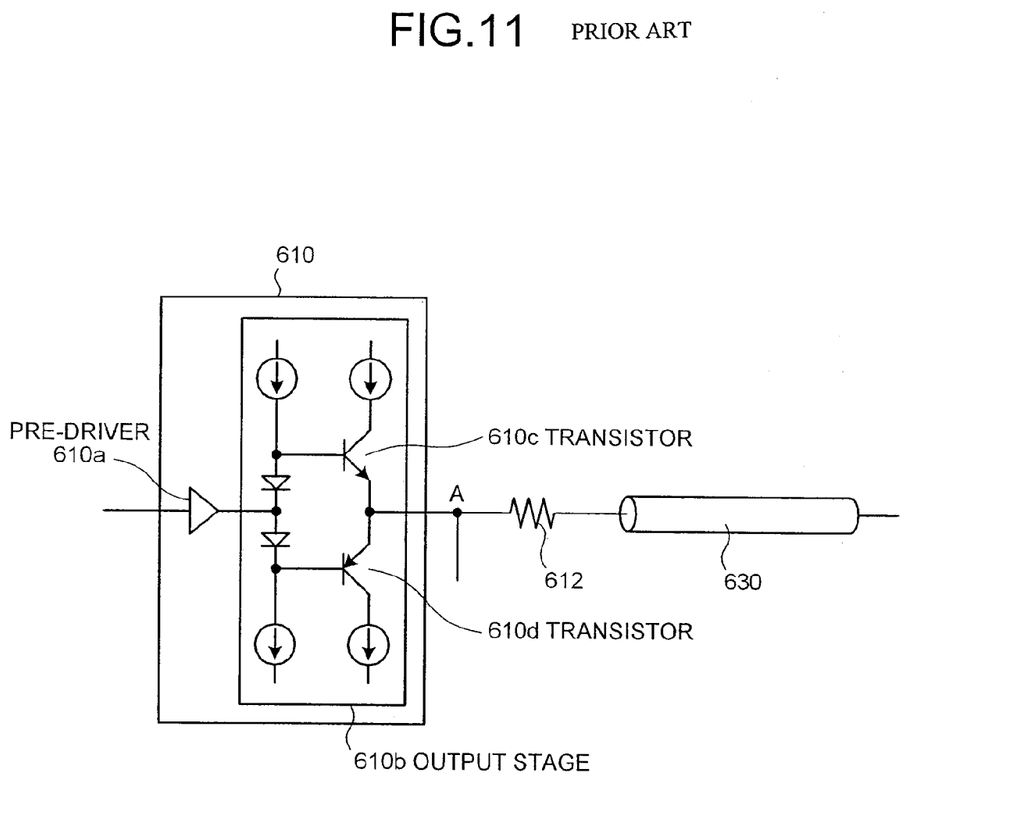
FIG. 11 is an explanatory diagram of an internal resistance in a driver shown in FIG. 9.

In addition, as shown in FIG. 11, an output stage 610b of the driver 610 has transistors 610c and 610d, which means presence of emitter resistance of the range from a few ohms (O) to a few ten O in the driver 610. Since the semiconductor testing circuits 601 and 701 are structured based on the assumption that the output impedance of the driver 610 is zero, a precise comparison as logically expected from the illustrations of FIGS. 9 and 10 cannot be realized in the semiconductor testing circuits 601 and 701 due to the presence of the emitter resistance in the driver 610. Thus, the precise determination on the defectiveness of the DUT is hampered.

Further, the semiconductor testing circuit 601 shown in FIG. 9 is structured as to require a point A, at which an output voltage of a signal output from the driver 610 is detected, between the driver 610 and an output resistor 612. On the other hand, an open collector type driver, for which a transistor serves as a coupling point, is structured as not to include the point A, at which the output voltage of a signal output from the driver 610 is detected. Hence, the open collector type driver cannot be utilized as the driver 610 in the semiconductor testing circuit 601. Thus, a driver structure employable in the semiconductor testing circuit 601 is limited.

SUMMARY OF THE INVENTION

In view of the foregoing, an object of the present invention is to provide a semiconductor testing apparatus capable of achieving precise comparison by the comparator when being electrically connected to the DUT via a single transmission line for testing of the DUT.

According to one aspect of the present invention, a semiconductor testing apparatus, includes a test signal generating unit that generates a test signal corresponding to a test pattern to output the generated test signal to a device under test; a comparison signal generating unit that generates a comparison signal by combining a reference signal and the test signal; and a comparing unit that compares the reference signal with a response signal, which is output from the device under test in response to the test signal, by offsetting the test signal contained in a composite signal of the test signal and the response signal with the test signal contained in the comparison signal. The device under test is determined to be defective or not based on a result of comparison by the comparing unit.

According to another aspect of the present invention, a method of testing a semiconductor to determine whether a device under test is defective or not, includes generating a test signal corresponding to a test pattern to output the generated test signal to the device under test; generating a comparison signal by combining a reference signal and the test signal; comparing the reference signal with a response signal, which is output from the device under test in response to the test signal, by offsetting the test signal contained in a composite signal of the test signal and the response signal with the test signal contained in the comparison signal; and determining whether the device under test is defective or not based on a result of comparison by the comparing unit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinbelow, a semiconductor testing apparatus according to a preferred embodiment of the present invention will be described with reference to the accompanying drawings. It should be noted that the present invention is not limited to the embodiment and modifications thereof described below. In the drawings, same portions are denoted by same reference characters.

Figure 1:
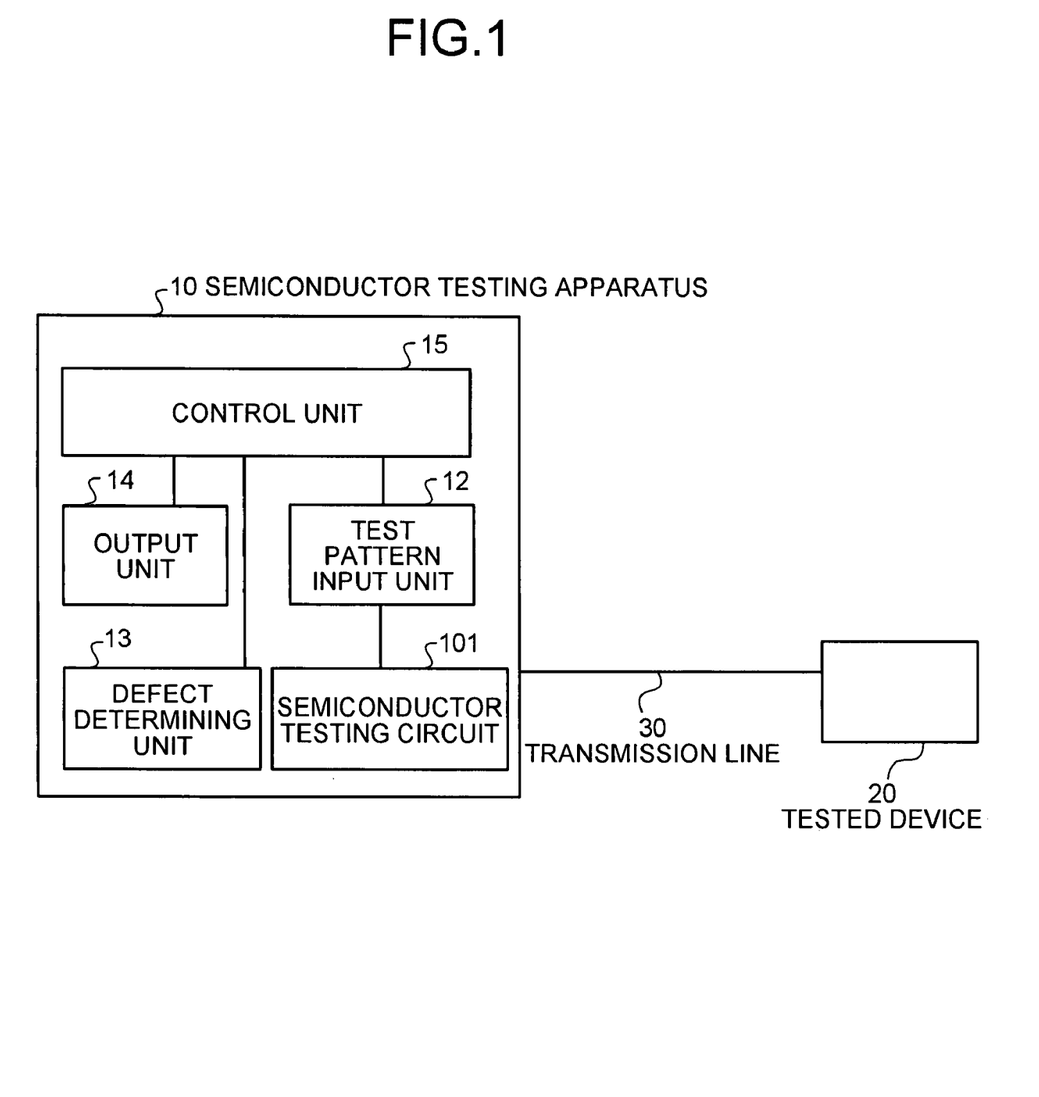
FIG. 1 is a block diagram of a schematic structure of a semiconductor testing apparatus according to an exemplary embodiment of the present invention.

First, a semiconductor testing apparatus according to the embodiment will be described. In the semiconductor testing apparatus according to the embodiment, a comparison signal is generated as a composite signal of a reference signal and a test signal. At comparison by comparators, the test signal contained in the composite signal is allowed to be offset by the test signal contained in the comparison signal. Thus, the comparators directly compare only the reference signal and the response signal. FIG. 1 is a block diagram of a schematic structure of the semiconductor testing apparatus according to the embodiment.

In FIG. 1, a semiconductor testing apparatus 10 of the embodiment includes a test pattern input unit 12, a semiconductor testing circuit 101, a defect determining unit 13, an output unit 14, and a control unit 15. Generally, the semiconductor testing apparatus 10 includes plural semiconductor testing circuits 101, each of which is connected to a node of a DUT 20 via a single transmission line 30.

The test pattern input unit 12 supplies a predetermined test pattern to the semiconductor testing circuit 101. The semiconductor testing circuit 101 generates a test signal corresponding to the received test pattern to output the generated test signal to the DUT 20. After comparing a reference signal with a response signal supplied from the DUT 20 in response to the input of the test signal, the semiconductor testing circuit 101 supplies the result of comparison to the defect determining unit 13. The semiconductor testing circuit 101 supplies an error signal when the response signal output from the DUT 20 does not match with the reference signal. The defect determining unit 13 determines whether the DUT 20 is defective or not based on the result of comparison supplied from the semiconductor testing circuit 101, and outputs the result of determination to the control unit 15. The output unit 14 outputs various pieces of information including the result of determination by the defect determining unit 13. The control unit 15 is realized with a read only memory (ROM) or a random access memory (RAM) that stores a predetermined processing program, and a central processing unit (CPU) that executes the processing program. The control unit 15 controls various processing and operations at the test pattern input unit 12, the semiconductor testing circuit 101, the defect determining unit 13, and the output unit 14.

Figure 2:
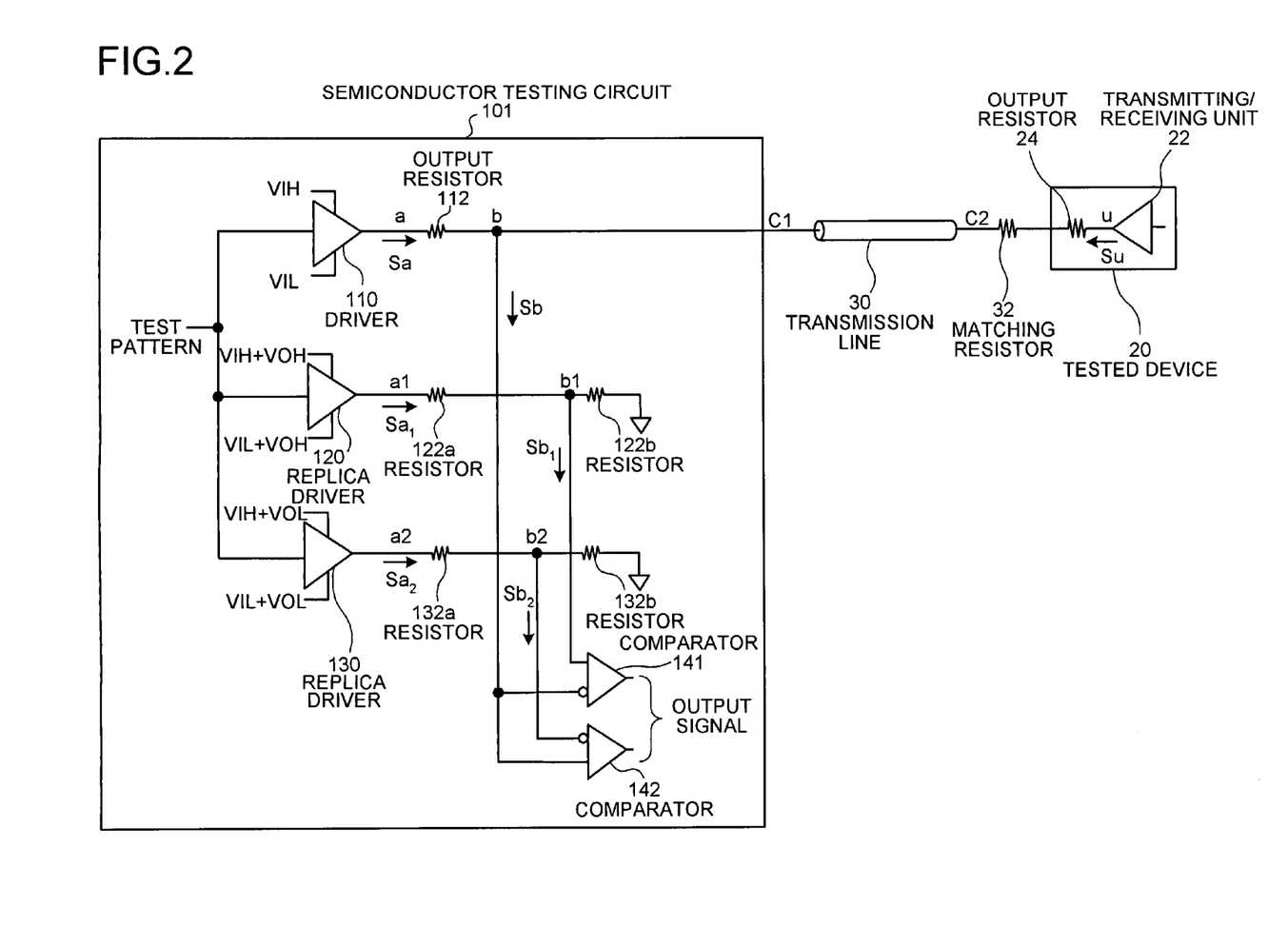
FIG. 2 is a diagram of a structure of a semiconductor testing circuit shown in FIG. 1.

Next, a circuit structure and a process operation of the semiconductor testing circuit 101 shown in FIG. 1 will be described. FIG. 2 is a diagram of the structure of the semiconductor testing circuit 101 shown in FIG. 1. As shown in FIG. 2, the semiconductor testing circuit 101 includes a driver 110, an output resistor 112 arranged between the driver 110 and a transmission line 30, replica drivers 120 and 130 that are comparison signal-generating units connected in parallel with the driver 110, resistors 122a and 122b connected in series at an output side of the replica driver 120, resistors 132a and 132b connected in series at an output side of the replica driver 130, a comparator 141 which compares a signal $Sb_1$ supplied from point b1 where the resistors 122a and 122b are coupled and an inverted signal of a signal Sb from point b where the output resistor 112 and the transmission line 30 are coupled, and a comparator 142 which compares an inverted signal of a signal $Sb_2$ supplied from point b2 where the resistors 132a and 132b are coupled and the signal Sb.

The driver 110, on receiving a high-level test pattern, supplies a test signal corresponding to a voltage VIH to point a shown in FIG. 2, whereas on receiving a low-level test pattern, supplies a test signal corresponding to a voltage VIL to the point a. The driver 110 is electrically connected to the DUT 20 via the transmission line 30. A test signal Sa generated by the driver 110 is supplied as an output to the DUT 20 via the output resistor 112 and the transmission line 30. Then, the DUT 20 outputs a response signal Su in response to the test signal Sa. The response signal Su and the test signal Sa are subjected to voltage division to become the signal Sb, which is supplied to a negative input part of the comparator 141 and a positive input part of the comparator 142. Here, the output resistor 112 matches impedance on the transmission line 30 side and impedance on the semiconductor testing circuit 101 side. The resistance R0 of the output resistor 112 is equal to a real part resistance Z0 of the characteristic impedance of the transmission line 30. A matching resistor 32 matches impedance on the transmission line 30 side and impedance on the DUT 20 side. Sum of the resistance Rs of the matching resistor 32 and the resistance Ru of the output resistor 24 of the DUT 20 is equal to the real part resistance Z0 of the impedance of the transmission line 30.

The replica drivers 120 and 130 output a signal obtained as a result of superposition of the test signal corresponding to the test pattern supplied from the test pattern input unit 12 and the predetermined reference signal. The resistors 122a and 122b are voltage dividers which divide voltage of a signal $Sa_1$ supplied from the replica driver 120, whereas the resistors 132a and 132b are voltage dividers which divide voltage of a signal $Sa_2$ supplied from the replica driver 130. The resistance value of the resistors 122a, 122b, 132a, and 132b is equal to the resistance R0 of the output resistor 112.

The replica driver 120, on receiving a high-level test pattern, outputs a signal corresponding to a voltage (VIH+VOH) to point a1 shown in FIG. 2, whereas on receiving a low-level test pattern, outputs a signal corresponding to a voltage (VIL+VOH) to the point a1. The voltage divider formed with the resistors 122a and 122b divides the signal $Sa_1$ obtained as the result of superposition of the test signal and the predetermined reference signal supplied from the replica driver 120. A signal $Sb_1$ obtained as a result of the division is supplied to the positive input part of the comparator 141 as a comparison signal.

The replica driver 130, on receiving a high-level test pattern, outputs a signal corresponding to a voltage (VIH+VOL) to point a2 shown in FIG. 2, whereas on receiving a low-level test pattern, outputs a signal corresponding to a voltage (VIL+VOL) to the point a2. The voltage divider formed with the resistors 132a and 132b divides a signal $Sa_2$ obtained as a result of superposition of the test signal and the predetermined reference signal supplied from the replica driver 130. The signal $Sa_2$ obtained as a result of the division is supplied to the negative input part of the comparator 142 as a comparison signal.

The comparators 141 and 142 receive a signal Sb obtained as a result of voltage division of the test signal and the response signal supplied from the DUT 20 in response to the test signal at one input part and receive $Sb_1$ and $Sb_2$, respectively, obtained as a result of division of the superposed signal of the reference signal and the test signal at another input part. The comparators 141 and 142 offset the test signal contained in the signal Sb with the test signals contained in the signals $Sb_1$ and $Sb_2$, to directly compare only the response signal and the reference signal. Thus, the comparators 141 and 142 can compare the response signal with the reference signal despite the presence of the test signal output from the driver 110.

Further, the manner of offsetting of the test signal in the comparators 141 and 142 is described in detail. First, the semiconductor testing circuit 101 receives a test pattern from the test pattern input unit 12. As shown in FIG. 2, the test pattern supplied from the test pattern input unit 12 is further supplied to the driver 110, the replica driver 120, and replica driver 130 as inputs.

When the test pattern is at a high level, the driver 110 outputs the test signal corresponding to the voltage VIH to the point a. Hence, a voltage Va of the test signal Sa applied to the point a satisfies:

$$Va=VIH \tag{1}$$

The replica driver 120 outputs the signal corresponding to the voltage (VIH+VOH) to the point a1. Hence, the voltage Va1 of the signal $Sa_1$ applied on the point a1 satisfies:

$$Va1=VIH+VOH \tag{2}$$

The replica driver 130 outputs the signal corresponding to the voltage (VIH+VOL) to the point a2. Hence, the voltage Va2 of the signal $Sa_2$ applied on the point a2 satisfies:

$$Va2=VIH+VOH \tag{3}$$

When the test pattern is at a low level, the driver 110 outputs the test signal corresponding to the voltage VIL to the point a. Hence, the voltage Va of the test signal Sa applied to the point a satisfies:

$$Va=VIL \tag{4}$$

The replica driver 120 outputs the signal corresponding to the voltage (VIL+VOH) to the point a1. Hence, the voltage Va1 of the signal $Sa_1$ applied on the point a1 satisfies:

$$Va1=VIL+VOH \tag{5}$$

The replica driver 130 outputs the signal corresponding to the voltage (VIL+VOL) to the point a2. Hence, the voltage Va2 of the signal $Sa_2$ applied on the point a2 satisfies:

$$Va2=VIL+VOL \tag{6}$$

In the DUT 20, a transmitting/receiving unit 22 receives the test signal output from the driver 110 and outputs the response signal Su corresponding to the voltage Vu to point u. The response signal Su is supplied to the semiconductor testing circuit 101 via the output resistor 24, the matching resistor 32, and the transmission line 30.

Here, as described above, the resistance R0 of the output resistor 112, the real part resistance Z0 of the impedance of the transmission line 30, the resistance Rs of the matching resistor 32, and the resistance value Ru of the output resistor 24 have the following relation:

$$Z0=R0=Rs+Ru \tag{7}$$

Thus, since the impedance on two ends of the transmission line 30 match with each other, if delay time of the transmission line 30 is ignored, the voltage level of the signal on point c1 is equal to the voltage level of the signal on point c2.

Further, since the voltage Vb of the signal Sb branched in the direction of the comparators 141 and 142 from the point b is a division of the voltage Va of the test signal Sa supplied to the point a and the voltage Vu of the response signal Su supplied to the point u, if the delay of the transmission line 30 is ignored, $$Vb=(Va+Vu)/2 \quad (8)$$

Then, the signal Sb corresponding to the voltage Vb is supplied to the negative input part of the comparator 141 and the positive input part of the comparator 142.

The resistors 122a and 122b function as voltage dividers and the resistance values of the resistors 122a and 122b are the same. Hence, the voltage Vb1 of the signal $Sb_1$ which is branched from the point b1 to the comparator 141 is a division of the voltage Va1 of the signal $Sa_1$ applied to the point a1 by two. Hence, $$Vb1=Va1/2 \quad (9)$$

The signal $Sb_1$ corresponding to the voltage Vb1 is supplied to the positive input part of the comparator 141.

The resistors 132a and 132b function as voltage dividers and the resistance values of the resistors 132a and 132b are the same. Hence, the voltage Vb2 of the signal $Sb_2$ which is branched from the point b2 to the comparator 142 is a division of the voltage Va2 of the signal $Sa_2$ applied to the point a2 by two. Hence, $$Vb2=Va2/2 \quad (10)$$

The signal $Sb_2$ corresponding to the voltage Vb2 is supplied to the negative input part of the comparator 142.

Further, relations among respective signals are described in detail according to Expressions (1) to (10) above. When the test pattern is at a high level, the following expressions (11) to (13) are obtained. First, according to Expressions (1) and (8), $$Vb=(VIH+Vu)/2 \quad (11)$$

can be obtained. Further, according to Expressions (2) and (9), $$Vb1=(VIH+VOH)/2 \quad (12)$$

can be obtained. Still further, according to Expressions (3) and (10), $$Vb2=(VIH+VOH)/2 \quad (13)$$

can be obtained.

On the other hand, when the test pattern is at a low level, the following expressions (14) to (16) are obtained. According to Expressions (4) and (8), $$Vb=(VIL+Vu)/2 \quad (14)$$

can be obtained. Further, according to Expressions (5) and (9), $$Vb1=(VIL+VOH)/2 \quad (15)$$

can be obtained. Still further, according to Expressions (6) and (10), $$Vb2=(VIL+VOL)/2 \quad (16)$$

can be obtained.

Thus according to Expressions (11) and (14), the signal Sb which is a composite signal of the test signal and the response signal is input to the negative input part of the comparator 141 and the positive input part of the comparator 142. Further, according to Expressions (12) and (15), the replica driver 120 and the resistors 122a and 122b divide the signal obtained via the superposition of the reference signal and the test signal output from the replica driver 120 by two and supply the resulting signal $Sb_1$ to the positive input part of the comparator 141. Still further, according to Expressions (13) and (16), the replica driver 130 and the resistors 132a and 132b divide the signal obtained via the superposition of the reference signal and the test signal output from the replica driver 130 by two, and supply the resulting signal $Sb_2$ to the negative input part of the comparator 142.

Here, the comparators 141 and 142, when the level of the signal supplied from the positive input part is higher than the level of the signal input from the negative input part, output the error signal at a high level, whereas when the level of the signal input from the positive input part is lower than the level of the signal input from the negative input part, output the error signal at a low level.

In the comparator 141, the voltage of the signal $Sb_1$ input to the positive input part is Vb1 whereas the voltage of the signal Sb input to the negative input part is Vb. Hence, regardless of whether the level is high or low, according to Expressions (11), (12), (14), and (15), $$Vb1-Vb=(VOH-Vu)/2 \quad (17)$$

Hence, the test signals VIH and VIL contained in the signal $Sb_1$ supplied to the positive input part of the comparator 141 is offset by the test signals VIH and VIL contained in the signal Sb supplied to the negative input part of the comparator 141. Thus, the comparator 141 can compare only the reference signal VOH contained in the signal $Sb_1$ supplied to the positive input part and the response signal Vu contained in the signal Sb supplied to the negative input part.

As a result, the comparator 141 outputs the error signal at a high level when Vb1−Vb>0, i.e., when VOH−Vu>0, whereas outputs the error signal at a low level when Vb1−Vb<0, i.e., when VOH−Vu<0.

On the other hand, in the comparator 142, the voltage of the signal Sb supplied to the positive input part is Vb and the voltage of the signal $Sb_2$ supplied to the negative input part is Vb2. Hence, regardless of whether the test pattern is at a high level or a low level, according to the expressions (11), (13), (14), and (16), $$Vb-Vb2=(Vu-VOL)/2 \quad (18)$$

Hence, similarly to the comparator 141, the test signals VIH and VIL contained in the signal Sb supplied to the positive input part of the comparator 142 are offset by the test signals VIH and VIL contained in the signal $Sb_2$ supplied to the negative input part of the comparator 142. Thus, the comparator 142 can compare only the response signal Vu contained in the signal Sb supplied to the positive input part and the reference signal VOL contained in the signal $Sb_2$ supplied to the negative input part.

As a result, the comparator 142 outputs the error signal at a high level when Vb−Vb2>0, i.e., when Vu−VOL>0, whereas outputs the error signal at a low level when Vb−Vb2<0, i.e., when Vu−VOL<0.

Thus, the comparators 141 and 142 compare the voltage Vu of the response signal output from the DUT 20 and the voltage VOH and VOL of the reference signals, respectively. In other words, the comparators 141 and 142 can compare the response signal Vu output from the DUT 20 and the reference signals VOH and VOL regardless of the presence of the test signals VIH and VIL supplied from the driver 110.

According to the embodiment, the response signal output from the DUT 20 can be compared with the reference signal regardless of the presence of the test signal supplied from the driver and regardless of the manner of electrical connection between the semiconductor testing circuit 101 and the DUT 20, i.e., the connection via the single transmission line 30. Hence, the semiconductor testing circuit 101 according to the embodiment does not need to be held in a stand-by state during the reciprocation (round-trip) of the signal on the transmission line 30 at the change of direction of signal transmission, thereby realizes the speedy detection of the defect of the DUT 20. In addition, the electrical connection of the semiconductor testing circuit 101 and the DUT 20 via the single transmission line 30 in the embodiment allows for realization of more simplified structure of the semiconductor testing circuit 101 compared with the structure of the conventional semiconductor testing circuit which employs the dual transmission connection. Still in addition, since the semiconductor testing apparatus according to the embodiment, not employing the plural transmission lines, is applicable to various DUTs with varying driving capacity.

The semiconductor testing circuits 601 and 701 according to the conventional art can perform operation only in a limited voltage range and cannot realize highly precise and fast operation, since the (analog) subtracter 615 included therein is not appropriate for the realization of highly precise operation.

On the other hand, the semiconductor testing circuit 101 according to the embodiment does not include the subtracter. In other words, the semiconductor testing circuit 101 does not need to perform the subtracting operation which precision is difficult to improve. Hence, the semiconductor testing circuit 101 allows for the realization of highly precise operation and high processing speed compared with the semiconductor testing circuits 601 and 701 according to the conventional art, and further is applicable to the testing of semiconductor devices of wider voltage range. Still further, since the semiconductor testing circuit 101 according to the embodiment does not include the subtracter, more compact circuit can be realized.

Figure 3:
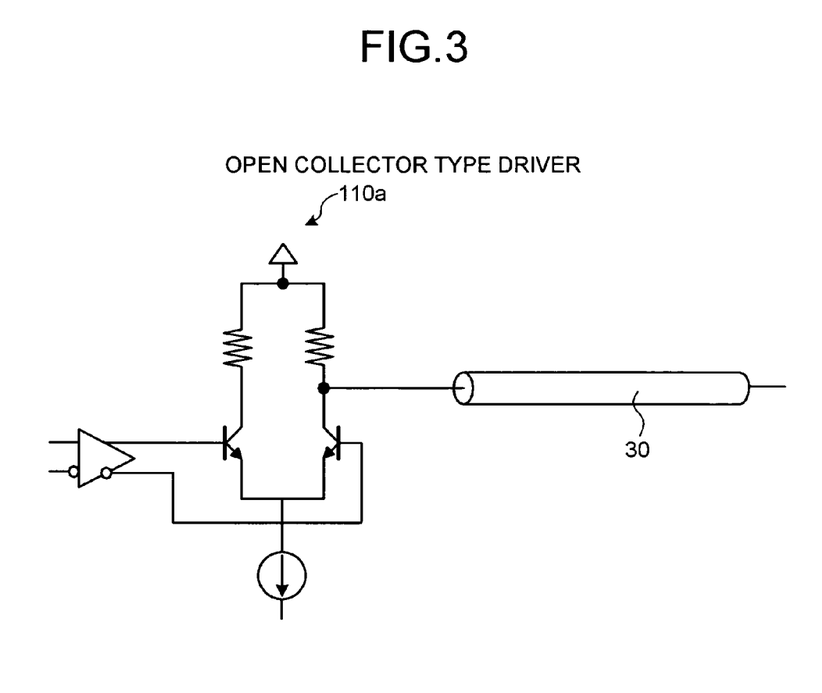
FIG. 3 is a diagram of a structure of an open collector type driver.

Still further, the semiconductor testing circuit 101 of the embodiment is different from the semiconductor testing circuit 601 according to the conventional art in that the semiconductor testing circuit 101 does not have the point "A" for the detection of the voltage of the driver 110. Hence, the open collector type driver 110a shown in FIG. 3 can be adopted in the semiconductor testing circuit 101 as the driver 110 shown in FIG. 2. Hence, a wider variety of driver structure can be applied for the driver 110 in the semiconductor testing circuit 101 according to the embodiment compared with the semiconductor testing circuit 601 according to the conventional art.

Figure 4:
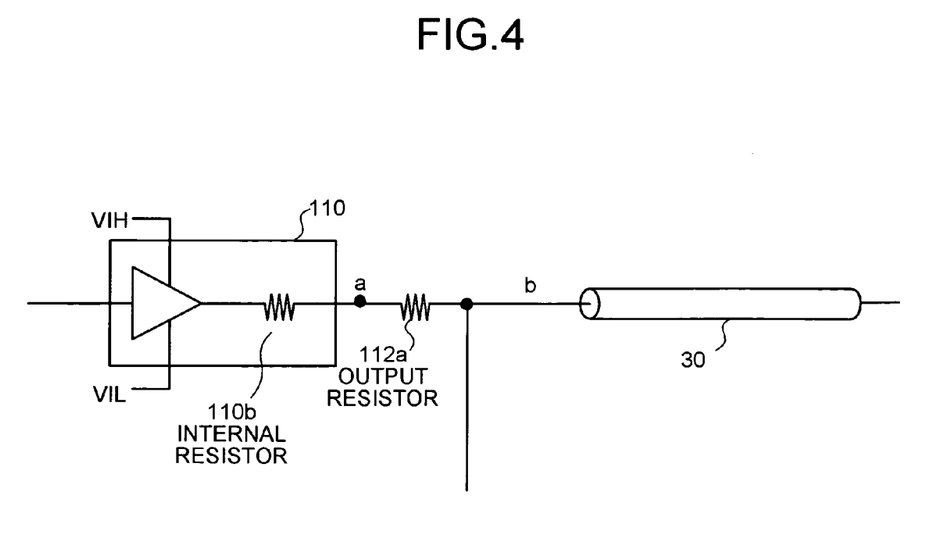
FIG. 4 is an explanatory diagram of an internal resistance in a driver shown in FIG. 2.

Further as shown in FIG. 4, when an internal resistor 110b with a resistance value Ri is included in the driver 110, a further provision of an output resistor 112a with resistance value (R0-Ri) can render the circuit capable of performing an equivalent operation to the semiconductor testing circuit 101 shown in FIG. 2. When the internal resistor is included in the replica drivers 120 and 130, a similar effect can be obtained by setting the resistance values of the resistors 122a and 132a connected in series with the replica drivers 120 and 130, respectively, to values lower than the resistance R0 by the amount of internal resistance of the replica drivers 120 and 130, respectively. Thus, in the embodiment, even when the internal resistance such as the emitter resistance is present in the driver 110 and replica drivers 120 and 130, the precise comparison can be realized in the comparators 141 and 142 via the adjustment of the resistance of the output resistor 110 and the resistors 122a and 132a.

Here in the semiconductor testing circuit 101, the driver 110, the replica drivers 120 and 130, the output resistor 112, the resistors 122a, 122b, 132a, and 132b may be provided in the same integrated circuit (IC) or may be provided in different ICs.

Figure 5:
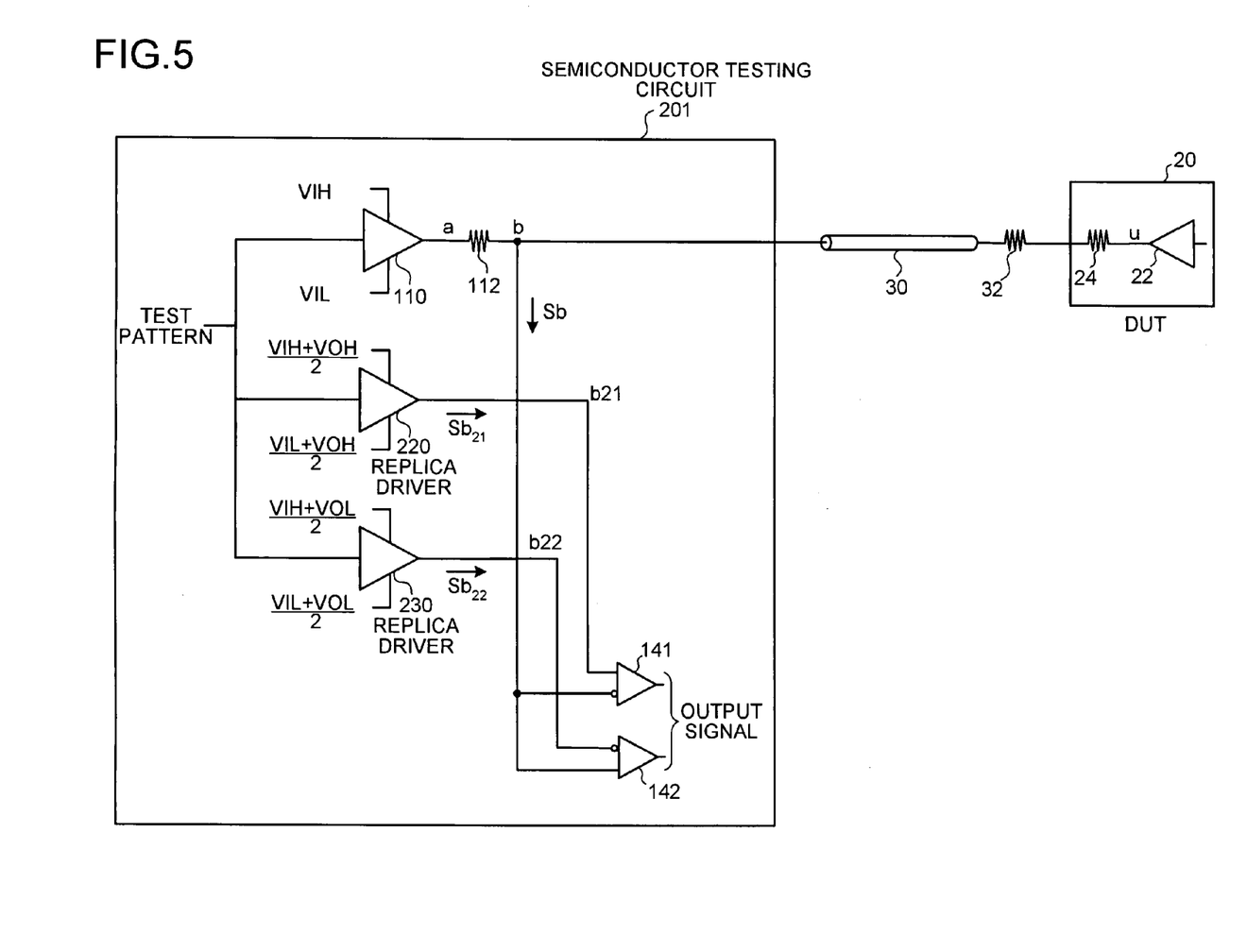
FIG. 5 is a diagram of a structure of a semiconductor testing circuit according to a first modification of the exemplary embodiment.

A first modification of the semiconductor testing circuit according to the embodiment will be described. FIG. 5 is a diagram of a structure of a semiconductor testing circuit according to the first modification. As shown in FIG. 5, the semiconductor testing circuit 201 according to the first modification includes replica drivers 220 and 230 in place of the replica drivers 120 and 130 in the semiconductor testing circuit 101 shown in FIG. 2, while the resistors 122a, 122b, 132a, and 132b of the semiconductor testing circuit 101 are removed.

The replica driver 220 outputs a signal corresponding to a voltage ((VIH+VOH)/2) to point b21 shown in FIG. 5 when the input test pattern is at a high level, whereas outputs a signal corresponding to a voltage ((VIL+VOH)/2) when the input test pattern is at a low level. The replica driver 230 outputs a signal corresponding to a voltage ((VIH+VOL)/2) to point b22 shown in FIG. 5 when the input test pattern is at a high level, whereas outputs a signal corresponding to a voltage ((VIL+VOL)/2) when the input test pattern is at a low level. Thus, the replica drivers 220 and 230 divide the superposed signal of the reference signal and the test signal to output the resulting signal as a comparison signal, and therefore the resistors 122a, 122b, 132a, and 132b serving to perform division are not necessary.

As a result, in the semiconductor testing circuit 201, the comparators 141 and 142 can directly compare the reference signal and the response signal while offsetting the test signal contained in the supplied signal Sb with the test signal in the signal $Sb_{21}$ and $Sb_{22}$, respectively, since the signals supplied to the comparators 141 and 142 are same with those in the semiconductor testing circuit 101 shown in FIG. 2. Further, the semiconductor testing circuit 201 according to the first modification can realize more simplified circuit structure compared with the semiconductor testing circuit 101 since the resistors 122a, 122b, 132a, and 132b are removed.

Figure 6:
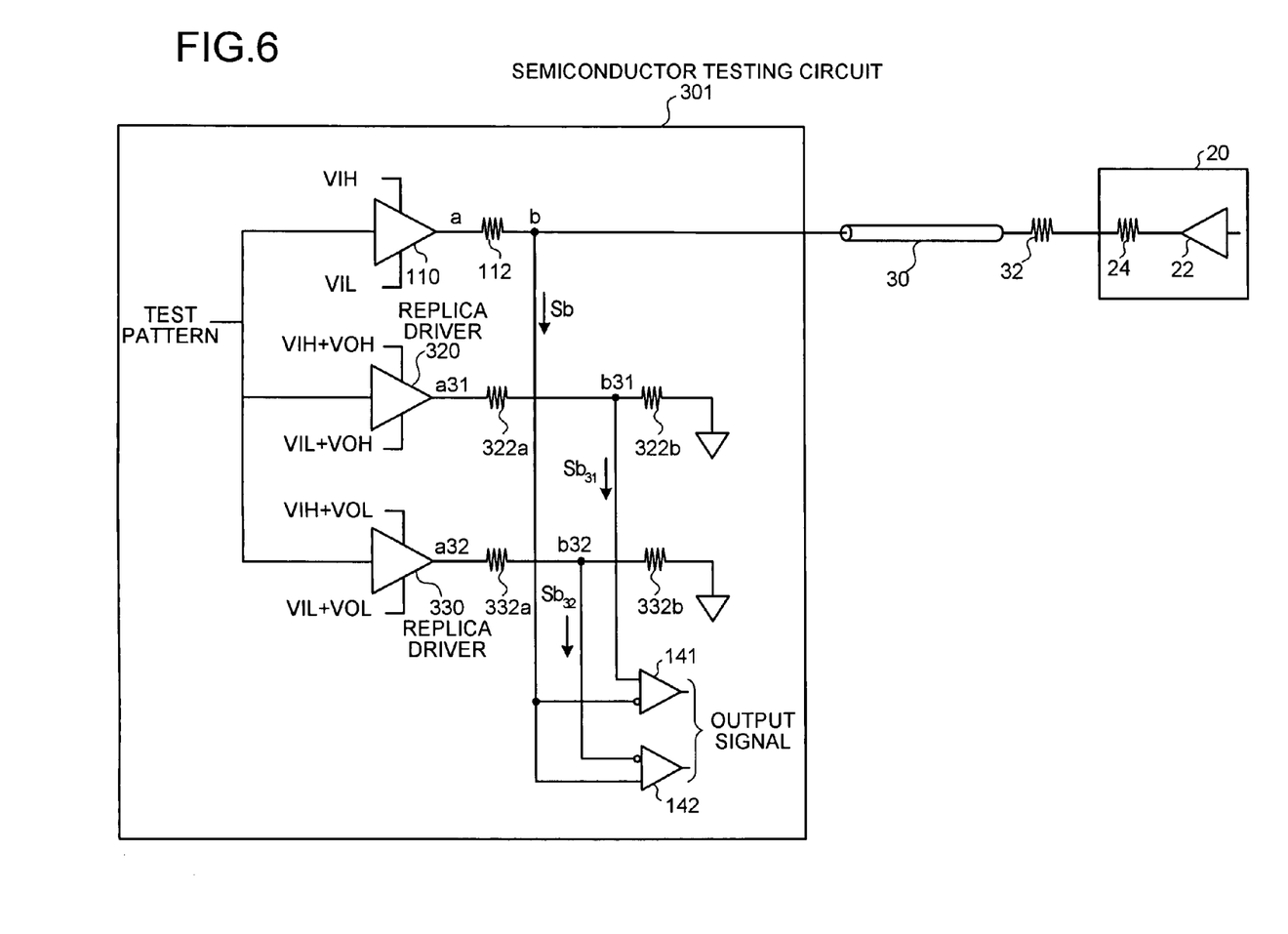
FIG. 6 is a diagram of a structure of a semiconductor testing circuit according to a second modification of the exemplary embodiment.

A second modification of the semiconductor testing circuit according to the embodiment will be described. FIG. 6 is a diagram of a structure of a semiconductor testing circuit according to the second modification. The semiconductor testing circuit 301 according to the second modification shown in FIG. 6 includes replica drivers 320 and 330 in place of the replica drivers 120 and 130 of the semiconductor testing circuit 101 shown in FIG. 2, and further includes resistors 322a, 322b, 332a, and 332b in place of the resistors 122a, 122b, 132a, and 132b of the semiconductor testing circuit 101.

Transistors at the last stage of the replica drivers 320 and 330 are 1/N in size compared with the transistors at the last stage of the replica drivers 120 and 130 of the semiconductor testing circuit 101 of FIG. 2. In other words, the number of transistors at the last stage of the replica drivers 320 and 330 is 1/N that of the transistors at the last stage of the replica drivers 120 and 130 shown in FIG. 2. Here, the voltage levels of the signals output from the replica drivers 320 and 330 are same with the voltage levels of the signals from the replica drivers 120 and 130 in FIG. 2. Further, the resistance values of the resistors 322a, 322b, 332a and 332b shown in FIG. 6 are N times those of the resistors 122a, 122b, 132a, and 132b in FIG. 2. As a result, the current value of the signal supplied from the replica drivers 320 and 330 is 1/N the current value of the signal supplied from the replica drivers 120 and 130 of FIG. 2.

Hence, in the semiconductor testing circuit 301, the signal which passes through the resistors 322a and 332a exhibits the same waveform with that of the signal passing through the resistors 122a and 132a in the semiconductor testing circuit 101. For example, if the test pattern is at a high level, a voltage Vb31 of a signal $Sb_{31}$ branched from point b31 shown in FIG. 6 to the comparator 141 is at the level of ((VIH+VOH)/2), whereas a voltage Vb32 of a signal $Sb_{32}$ branched from point b32 to the comparator 142 is at the level of ((VIH+VOL)/2).

Thus, the signal supplied to the comparators 141 and 142 in the semiconductor testing circuit 301 are same with those in the semiconductor testing circuit 101 shown in FIG. 2, even when the resistance values of the resistors 322a, 322b, 332a, and 332b are changed corresponding to the current values of the signals supplied from the replica drivers 320 and 330. Hence, the comparators 141 and 142 can directly compare the reference signal and the response signal while offsetting the test signal contained in the supplied signal Sb with the test signals in the signal $Sb_{31}$ and the signal $Sb_{32}$. Further, in the semiconductor testing circuit 301 according to the second modification, the size of the transistors in the last stage of the replica drivers 320 and 330 is relatively smaller than the size of the transistors in the last stage of the replica drivers 120 and 130. Hence, the reduction in power consumption by the replica drivers 320 and 330 can be realized. Thus, according to the semiconductor testing circuit 301 of the second modification, the power consumption of the semiconductor testing circuit 301 as a whole can be reduced compared with the semiconductor testing circuit 101.

Figure 7:
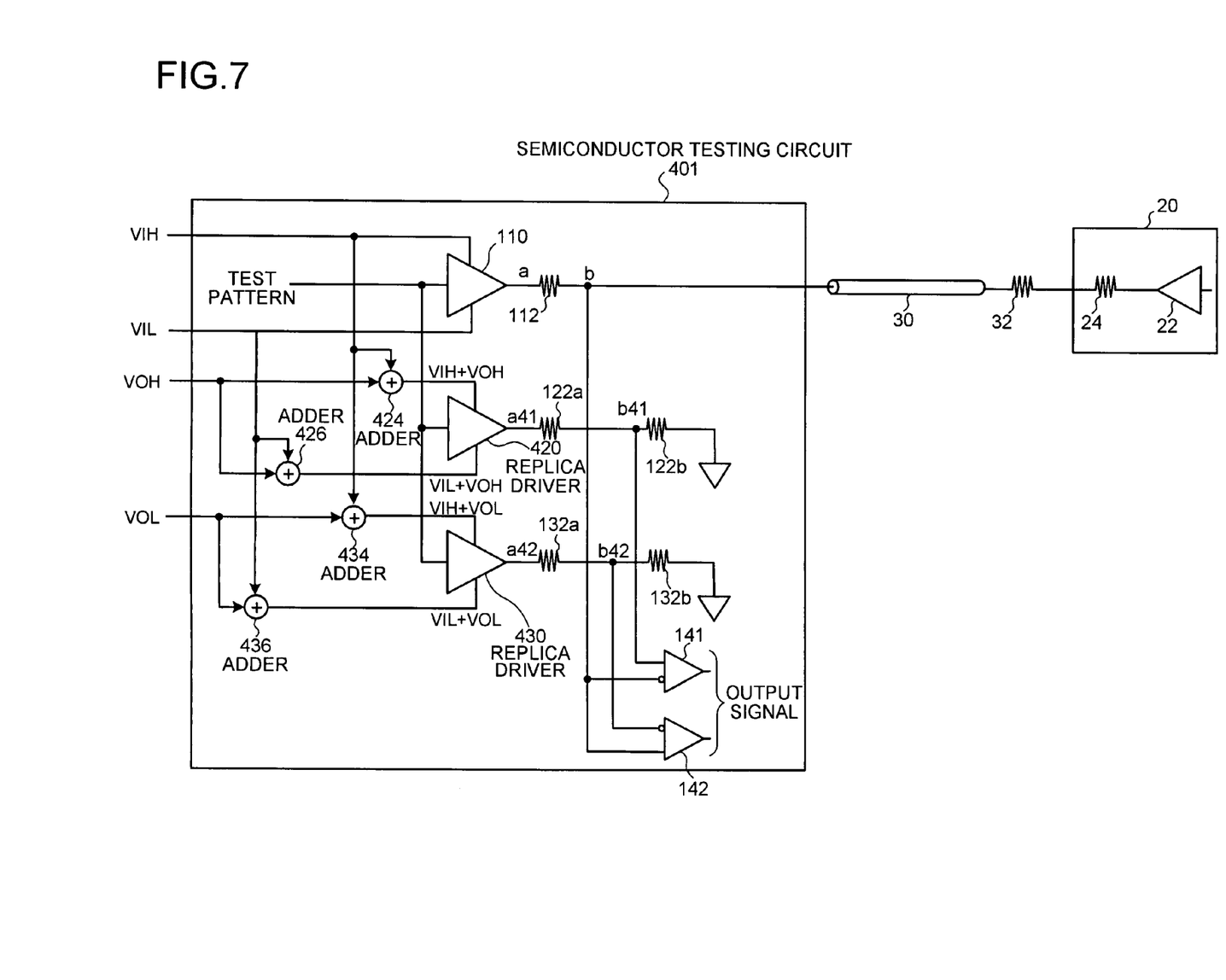
FIG. 7 is a diagram of a structure of a semiconductor testing circuit according to a third modification of the exemplary embodiment.

A third modification of the semiconductor testing circuit according to the embodiment will be described. FIG. 7 is a diagram of a structure of a semiconductor testing circuit according to the third modification. The semiconductor testing circuit 401 according to the third modification shown in FIG. 7 further includes adders 424, 426, 434, and 436 in addition to the elements in the semiconductor testing circuit 101 shown in FIG. 2. In the semiconductor testing circuit 401, voltage is supplied at the level of VIH, VIL, VOH, and VOL, respectively, and the replica drivers 420 and 430 supply the signals generated through the analog operation inside the semiconductor testing circuit 401.

Here, the replica driver 420 outputs a signal corresponding to the voltage (VIH+VOH) when the test pattern is at a high level, since the voltage VIH is added to the voltage VOH at the adder 424. Further, the replica driver 420 outputs a signal corresponding to the voltage (VIL+VOH) when the test pattern is at a low level due to the addition at the adder 426. Similarly, the replica driver 430 outputs a signal corresponding to the voltage (VIH+VOL) when the test pattern is at a high level due to the addition at the adder 434, whereas outputs a signal corresponding to the voltage (VIL+VOL) when the test pattern is at a low level due to the addition at the adder 436. Further, the signals supplied from the replica drivers 420 and 430 are divided by two through the resistors 122a, 122b, and 132a, and 132b, respectively, and the resulting signal is supplied as a comparison signal into the comparators 141 and 142, respectively.

Thus, in the semiconductor testing circuit 401, the comparators 141 and 142 can directly compare the reference signal and the response signal while offsetting the test signal contained in the supplied signals, since the signals supplied to the comparators 141 and 142 are same with those in the semiconductor testing circuit 101 shown in FIG. 2.

Figure 8:
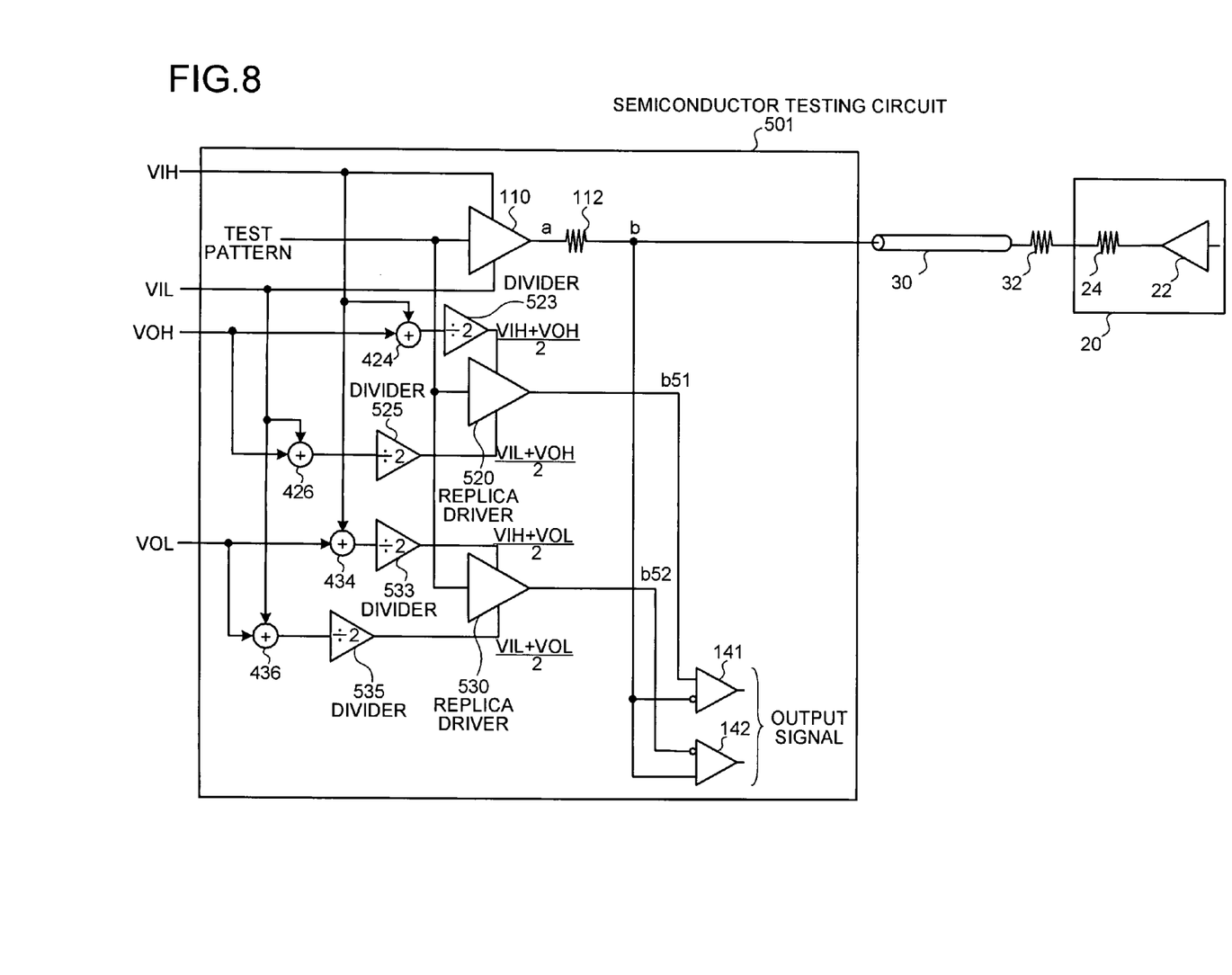
FIG. 8 is another example of the structure of the semiconductor testing circuit according to the third modification of the exemplary embodiment.

Alternatively, a semiconductor testing circuit 501 as shown in FIG. 8 may be realized as the third embodiment, where the semiconductor testing circuit 501 further includes dividers 523, 525, 533, and 535, in addition to the elements in the semiconductor testing circuit 401, while the resistors 122a, 122b, 132a, and 132b are removed.

Then, a replica driver 520 outputs a signal corresponding to the voltage ((VIH+VOH)/2) via the divider 523 when the test pattern is at a high level, whereas outputs a signal corresponding to the voltage ((VIL+VOH)/2) via the divider 525 when the test pattern is at a low level. Similarly, a replica driver 530 outputs a signal corresponding to the voltage ((VIH+VOL)/2) via the divider 533 when the test pattern is at a high level, whereas outputs a signal corresponding to the voltage ((VIL+VOL)/2) via the divider 535 when the test pattern is at a low level. Since the replica drivers 520 and 530 output the signal obtained via division of the superposed signal of the reference signal and the test signal by two, the resistors 122a, 122b, 132a, and 132b which perform division operation are not necessary.

Thus, in the semiconductor testing circuit 501, the comparators 141 and 142 can compare the reference signal and the response signal while offsetting the test signal, since the signals supplied to the comparators 141 and 142 are same with those in the semiconductor testing circuit 101 shown in FIG. 2. Further, in the semiconductor testing circuit 501 shown in FIG. 8, a more simplified circuit structure can be realized with the elimination of the resistors 122a, 122b, 132a, and 132b compared with the semiconductor testing circuit 401 shown in FIG. 7.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor testing apparatus, comprising:
   a test signal generating unit that generates a test signal corresponding to a test pattern to output the generated test signal to a device under test and a comparison signal generating unit;
   the comparison signal generating unit that generates a comparison signal by combining a reference signal and the test signal, wherein the comparison signal comprises a superposed signal of the reference signal and the test signal; and
   a comparing unit that receives the comparison signal and a composite signal and offsets the test signal superposed in the comparison signal with the test signal superposed in the composite signal to obtain a comparison between the reference signal and a response signal, the response signal being output from the device under test in response to the test signal input to the device under test from the test signal generating unit, wherein the composite signal comprises the test signal and the response signal being superposed, wherein
   the device under test is determined to be defective or not based on a result of comparison by the comparing unit.

2. The semiconductor testing apparatus according to claim 1, wherein
   the test signal generating unit and the device under test are electrically connected via a single transmission line.

3. The semiconductor testing apparatus according to claim 2, wherein
   the test signal generating unit includes a driver that generates the test signal, and an output resistor that matches impedance of the transmission line side and impedance of the semiconductor testing apparatus side.

4. The semiconductor testing apparatus according to claim 1, wherein
the comparison signal generating unit includes a replica driver that generates the superposed signal of the reference signal and the test signal, and
the comparison signal generating unit divides the superposed signal generated by the replica driver to output a result of division as the comparison signal.

5. The semiconductor testing apparatus according to claim 4, wherein
the division is performed by a voltage divider having plural resistors.

6. The semiconductor testing apparatus according to claim 5, wherein
a resistance value of each resistor is increased and decreased corresponding to a current value of the superposed signal generated by the replica driver.

7. The semiconductor testing apparatus according to claim 4, wherein
the comparison signal generating unit includes plural replica drivers.

8. The semiconductor testing apparatus according to claim 1, wherein
the comparison signal generating unit includes a replica driver which divides the superposed signal of the reference signal and the test signal, to output a result of division as the comparison signal.

9. The semiconductor testing apparatus according to claim 7, wherein the comparison signal generating unit includes plural replica drivers.

10. A method of testing a semiconductor to determine whether a device under test is defective or not, comprising:
generating a test signal corresponding to a test pattern to output the generated test signal to the device under test;
generating a comparison signal by combining a reference signal and the test signal;
comparing the reference signal with a response signal, which is output from the device under test in response to the test signal, by offsetting the test signal superposed in a composite signal, comprising the test signal and the response signal, with the test signal superposed in the comparison signal; and
determining whether the device under test is defective or not based on a result of comparison by the comparing unit.

11. A semiconductor testing apparatus, comprising:
a driver that generates a test signal corresponding to a test pattern based on a first test voltage and a second test voltage;
a first replica driver that generates a first comparison signal corresponding to the test pattern based on a first comparison voltage and a second comparison voltage, the first comparison voltage being obtained by adding the first test voltage and a first reference voltage, the second comparison voltage being obtained by adding the second test voltage and the first reference voltage;
a second replica driver that generates a second comparison signal corresponding to the test pattern based on a third comparison voltage and a fourth comparison voltage, the third comparison voltage being obtained by adding the first test voltage and a second reference voltage, the fourth comparison voltage being obtained by adding the second test voltage and the second reference voltage;

a first resistor, one end of the first resistor being connected to an output part of the driver and other end of the first resistor being connected to a single transmission line;
a second resistor, one end of the second resistor being connected to an output part of the first replica driver;
a third resistor, one end of the third resistor being connected to other end of the second resistor and other end of the third resistor being grounded;
a fourth resistor, one end of the fourth resistor being connected to an output part of the second replica driver;
a fifth resistor, one end of the fifth resistor being connected to other end of the fourth resistor and other end of the fifth resistor being grounded;
a first comparator that generates a first comparison result, a positive input part of the first comparator being connected to the one end of the third resistor, a negative input part of the first comparator being connected to the other end of the first resistor; and
a second comparator that generates a second comparison result, a negative input part of the second comparator being connected to the one end of the fifth resistor, a positive input part of the second comparator being connected to the other end of the first resistor.

12. The semiconductor testing apparatus according to claim 11, wherein
a resistance value of each of the second and the third resistor is increased and decreased corresponding to a current value of the first comparison signal generated by the first replica driver, and
a resistance value of each of the fourth and the fifth resistor is increased and decreased corresponding to a current value of the second comparison signal generated by the second replica driver.

13. The semiconductor testing apparatus according to claim 11, further comprising:
a first adder that generates the first comparison voltage by adding the first test voltage and the first reference voltage;
a second adder that generates the second comparison voltage by adding the second test voltage and the first reference voltage;
a third adder that generates the third comparison voltage by adding the first test voltage and the second reference voltage; and
a fourth adder that generates the fourth comparison voltage by adding the second test voltage and the second reference voltage.

14. A semiconductor testing apparatus, comprising:
a driver that generates a first test signal corresponding to a test pattern based on a first test voltage a second test voltage;
a first replica driver that generates a first comparison signal corresponding to the test pattern based on a first comparison voltage and a second comparison voltage, the first comparison voltage being obtained by dividing a first voltage by two, the first voltage being obtained by adding the first test voltage and a first reference voltage, the second comparison voltage being obtained by dividing a second voltage by two, the second voltage being obtained by adding the second test voltage and the first reference voltage;
a second replica driver that generates a second comparison signal corresponding to the test pattern based on a third comparison voltage and a fourth comparison voltage, the third comparison voltage being obtained by dividing a third voltage by two, the third voltage being obtained by adding the first test voltage and a second reference voltage, the fourth comparison voltage being obtained by dividing a fourth voltage by two, the fourth voltage being obtained by adding the second test voltage and the second reference voltage;

a first resistor, one end of the first resistor being connected to an output part of the driver and other end of the first resistor being connected to a single transmission line;

a first comparator that generates a first comparison result, a positive input part of the first comparator being connected to an output part of the first replica driver, a negative input part of the first comparator being connected to the other end of the first resistor; and a second comparator that generates a second comparison result, a negative input part of the second comparator being connected to an output part of the second replica driver, a positive input part of the second comparator being connected to the other end of the first resistor.

15. The semiconductor testing apparatus according to claim 14, further comprising;

a first adder that generates the first voltage by adding the first test voltage and the first reference voltage;

a first divider that is connected to the first adder and generates the first comparison voltage;

a second adder that generates the second voltage by adding the second test voltage and the first reference voltage;

a second divider that is connected to the second adder and generates the second comparison voltage;

a third adder that generates the third voltage by adding the first test voltage and the second reference voltage;

a third divider that is connected to the third adder and generates the third comparison voltage;

a fourth adder that generates the fourth voltage by adding the second test voltage and the second reference voltage; and a fourth divider that is connected to the fourth adder and generates the fourth comparison voltage.

* * * * *